United States Patent [19]
Derovanessian et al.

[11] Patent Number: 5,446,916
[45] Date of Patent: Aug. 29, 1995

[54] VARIABLE LENGTH CODEWORD PACKER

[75] Inventors: Henry Derovanessian, La Jolla; Vincent Liu, San Gabriel, both of Calif.

[73] Assignee: GI Corporation, Hatboro, Pa.

[21] Appl. No.: 31,011

[22] Filed: Mar. 26, 1993

[51] Int. Cl.⁶ .............................................. H03M 7/40
[52] U.S. Cl. ............................. 395/800; 364/DIG. 1; 364/239.3; 341/67; 341/65; 341/50; 341/60; 375/242; 375/240
[58] Field of Search ..................... 395/800; 341/67, 65, 341/50, 60; 364/DIG. 1, 239.3; 375/25, 122

[56] References Cited

U.S. PATENT DOCUMENTS

| | | | |
|---|---|---|---|
| 3,651,516 | 3/1972 | Andreae | 341/67 |
| 3,701,111 | 10/1972 | Cocke et al. | 340/172.5 |
| 4,914,675 | 4/1990 | Fedele | 375/25 |
| 5,079,548 | 1/1992 | Fujiyama et al. | 341/67 |
| 5,119,092 | 6/1992 | Sumi et al. | 341/60 |
| 5,150,430 | 9/1992 | Chu | 382/56 |
| 5,173,695 | 12/1992 | Sun et al. | 341/67 |
| 5,233,348 | 8/1993 | Pollmann et al. | 341/67 |
| 5,321,398 | 6/1994 | Ikeda | 341/67 |

Primary Examiner—Alyssa H. Bowler
Assistant Examiner—Walter D. Davis, Jr.
Attorney, Agent, or Firm—Barry R. Lipsitz

[57] ABSTRACT

A variable length codeword packer communicates codeword data in successive m-bit bytes. A binary sum is accumulated indicative of a total number of codeword bits received over time. A byte pointer is derived from at least one most significant bit of the binary sum. A bit pointer is derived from a plurality of least significant bits of the binary sum. A first data storage array has a plurality of m-bit first storage bytes and is responsive to the byte pointer for storing received codeword data in the first storage bytes. A second data storage array has a plurality of m-bit second storage bytes and is responsive to the byte and bit pointers for filling the second storage bytes with codeword data from the first data storage array. m-bit bytes of codeword data are output from each filled second storage byte to provide successive m-bit bytes of codeword data. The use of a multistage approach in packing variable length codewords substantially reduces the complexity as compared to single stage designs.

9 Claims, 4 Drawing Sheets

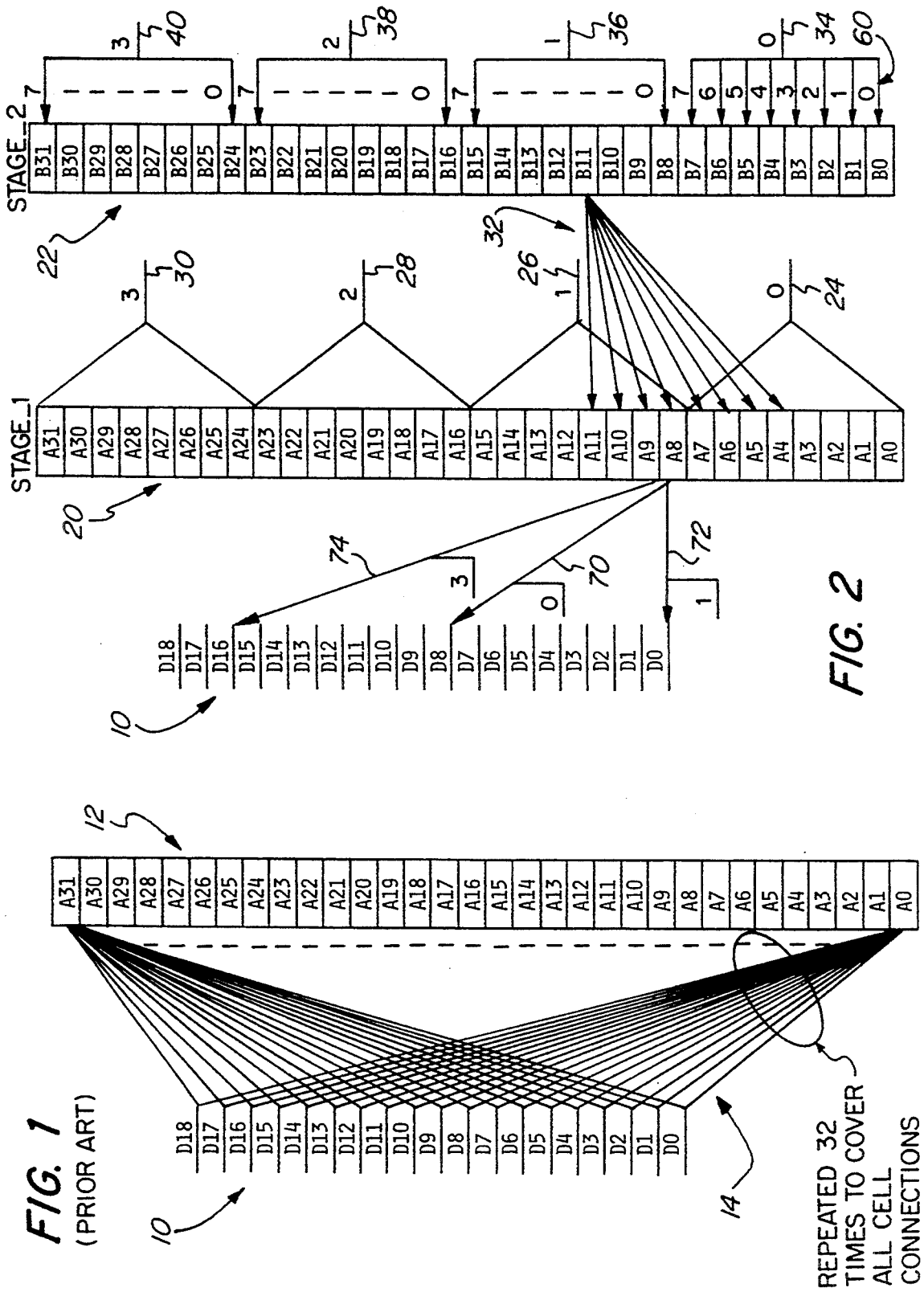

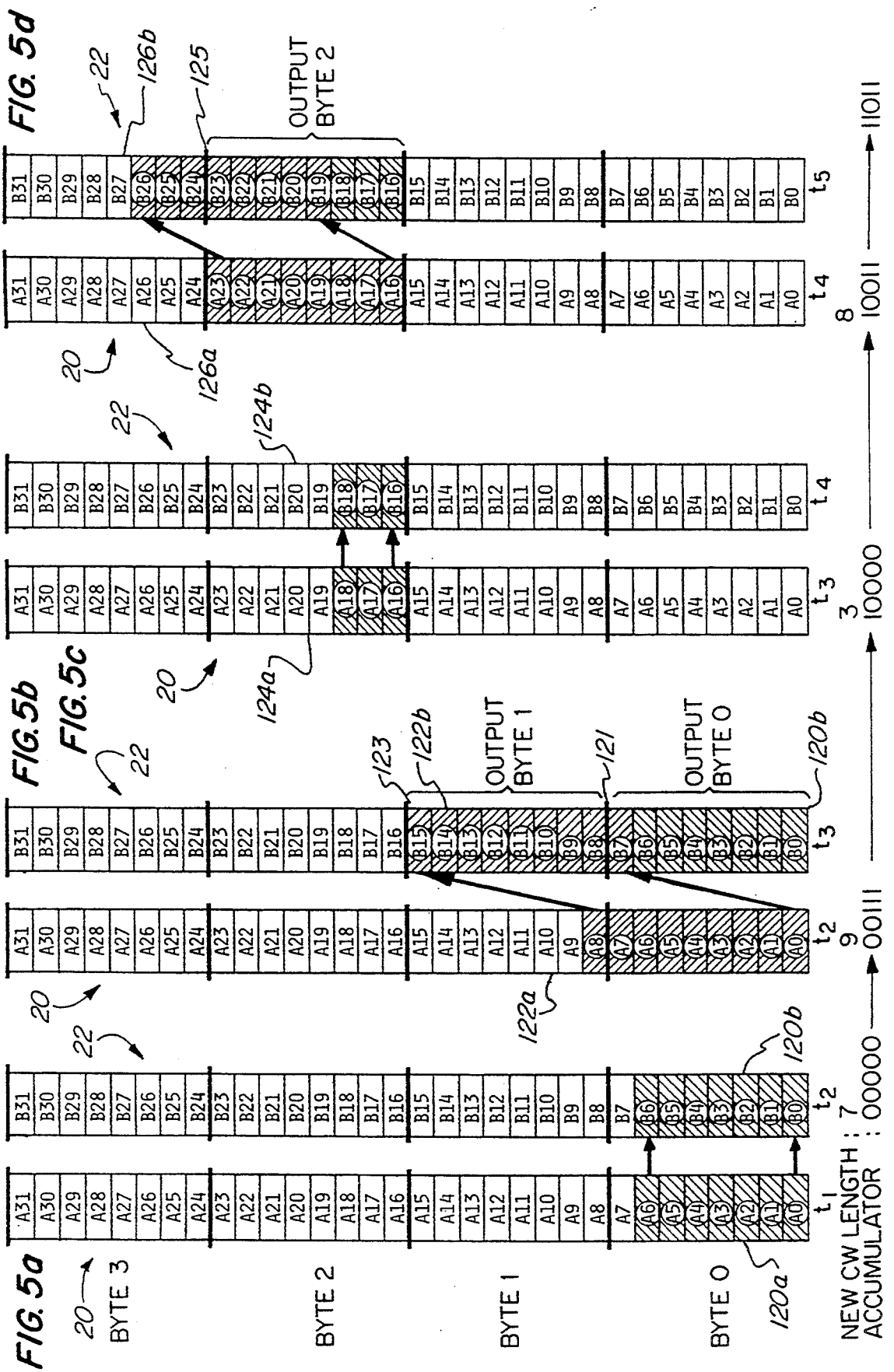

VARIABLE LENGTH CODEWORD PACKER

BACKGROUND OF THE INVENTION

The present invention relates to the communication of compressed digital data, and more particularly to apparatus for arranging variable length codewords for transmission in successive fixed length data bytes.

In order to efficiently use the available radio frequency spectrum for the communication of digital data, such as high definition television data, it is advantageous to compress the digital signals to minimize the amount of data that must be transmitted. One well known compression technique is referred to as variable length coding. A coding scheme of this type will cause bit strings of fixed length to be encoded into bit strings of variable length, with the more commonly occurring codes being represented by bit strings having lengths shorter than those of the fixed length codes. If the assignment of variable length codes is properly made, the average length of such codes in a given data stream will be much less than that of the corresponding fixed length codes, even though many of the variable length codes are much longer than the corresponding fixed length codes. One such variable length coding scheme is known as Huffman coding.

In order to transmit variable length encoded messages through a fixed bit rate system, a buffer that can store the messages should be maintained. In this manner, the variable length codewords can be accumulated and transmitted in fixed length bytes at a fixed bit rate.

Prior art input/output buffer interfaces are configured in a byte format. The variable bit codes are packed and formatted in the proper byte boundaries prior to writing them into the appropriate buffers. In such prior art schemes, each cell in a buffer array must be mapped to every single incoming data line, in order to pick off and store the variable length codes in a sequential order that enables the fixed rate output of fixed length bytes. Where the maximum codeword length is, for example, 19 bits, a 32-cell buffer array would require 608 electrical connections (19×32) in order to enable each cell to store any one of the 19 incoming bits. The implementation of such a structure is very complex, and requires a large amount of real estate in an integrated circuit implementation. Such complexity increases the cost of the device significantly.

It would be advantageous to provide a variable length codeword packer that reduces the required number of electrical connections. Such a codeword packer would be less complex than prior art structures, resulting in a lower cost.

The present invention provides a multistage variable codeword packer that facilitates the organization of the variable length codeword bits into appropriate byte boundaries.

SUMMARY OF THE INVENTION

In accordance with the present invention, a
variable length codeword packer is provided for use in communicating codeword data in successive m-bit bytes. Means are provided for accumulating a binary sum indicative of a total number of codeword bits received over time. A byte pointer is derived from at least one most significant bit of the binary sum. A bit pointer is derived from a plurality of least significant bits of the binary sum. A first data storage array has a plurality of m-bit first storage bytes and is responsive to the byte pointer for storing codeword data in the first storage bytes. A second data storage array has a plurality of m-bit second storage bytes and is responsive to the byte and bit pointers for filling the second storage bytes with codeword data from the first data storage array. Means are provided for outputting an m-bit byte of codeword data from each filled second storage byte to provide successive m-bit bytes of codeword data. Incoming variable length codewords are successively stored in the first data storage array, wherein each codeword commences at the beginning of a first storage byte identified by the byte pointer based on the binary sum of preceding codeword bit lengths. Each of the variable length codewords stored in the first data storage array is transferred to the second data storage array commencing at a location within a second storage byte identified by the byte pointer and the bit pointer based on the binary sum of preceding codeword bit lengths.

In an illustrated embodiment, the incoming codewords are grouped in sets (i.e., "superblocks") containing a plurality of codewords. The codeword packer further comprises means for resetting the accumulating means to zero at the beginning of each new set of codewords.

Also in the illustrated embodiment, the codewords have a maximum length of n bits. Each of the first and second data storage arrays comprise k storage bytes, each containing m cells, where $$k = \lceil (n+m-1)/m \rceil .$$

The accumulating means can comprise a q-bit accumulator with the p least significant bits thereof forming the bit pointer and the remaining (q-p) most significant bits forming the byte pointer. p is the number of bits required to identify any one of m cells in a storage byte and (q-p) is the number of bits required to identify any one of k storage bytes.

Codewords are sequentially clocked into the variable length codeword packer. Clock means are provided for clocking the codeword data into the first data storage array one codeword at a time. The byte pointer is also clocked into the first data storage array when a corresponding codeword is clocked therein. The codeword data from the first data storage array is clocked into the second data storage array one codeword at a time. The byte and bit pointers are clocked into the second data storage array when a corresponding codeword is clocked therein. In the illustrated embodiment, the codeword data is clocked into the second data storage array one clock cycle after it is clocked into the first data storage array. Means are provided for delaying the clocking of the byte and bit pointers into the second data storage array by one clock cycle so that the proper byte and bit pointers are provided to the second data storage array when it receives the corresponding codeword data.

The means for outputting m-bit bytes of codeword data from each filled second storage byte can be responsive to an incrementing of the byte pointer. In this manner, each time codeword data that is input to the second data storage array crosses a byte boundary, the preceding full byte of data will be output from the array.

BRIEF DESCRIPTION OF THE DRAWINGS

FIG. 1 is a diagrammatic illustration of a prior art codeword packer;

FIG. 2 is a diagrammatic illustration of a two-stage codeword packer in accordance with the present invention;

FIGS. 5a to 5d are diagrams showing examples of incoming codewords being loaded into the first stage array and the loading of the codewords from the first stage array into the second stage array.

DETAILED DESCRIPTION OF A PREFERRED EMBODIMENT

Figure 3:
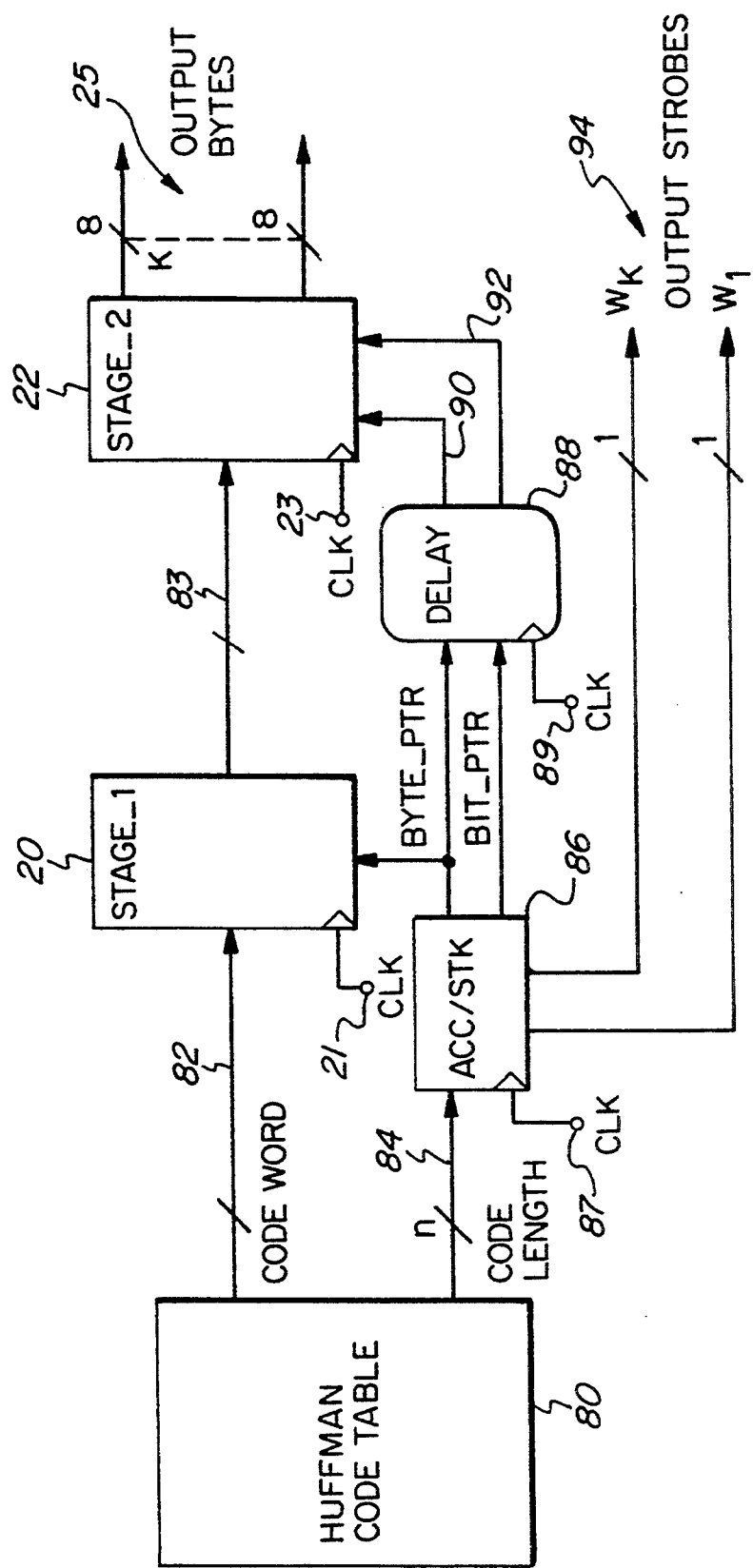
FIG. 3 is a block diagram illustrating an implementation of the two-stage codeword packer of FIG. 2.

Variable length coding of digital data is often advantageous in order to reduce the average bit rate necessary to communicate large amounts of data. Such schemes are typically used in image processing systems, such as high definition television systems, for transmitting video data within a limited bandwidth.

A prior art approach to packing variable length codewords into fixed byte lengths for transmission is illustrated in FIG. 1. An incoming codeword 10 which, for example, can comprise from one to 19 bits (D0 to D18) is loaded into a data storage array 12 that contains 32 cells (A0 to A31). Each codeword is transmitted together with information identifying the length of the codeword. The identifying information enables the loading of a current codeword into the data storage array 12 commencing at a cell which is immediately above the last cell filled by the previous codeword data. Thus, for example, if a three-bit codeword stored at A0 to A2 is followed by a five-bit codeword, the five-bit codeword will be stored at cells A3 to A7, completing an eight-bit byte (A0 to A7) which can then be output from the data storage array 12.

In order to load a new codeword commencing with any of the 32 registers contained in the array, it is necessary for each individual cell of the array to be connected to all 19 possible bit locations of each incoming codeword. This requires each of the 32 cells to be connected to 19 different codeword bit locations, for a total of 608 electrical connections. If longer codewords and/or a larger data storage array are required for a particular system implementation, the number of electrical connections will increase correspondingly. The complexity required by such prior art structures in terms of the number of electrical connections to each cell of the data storage array presents difficult implementation problems.

The present invention overcomes the prior art need for n connections to each cell, where n is the maximum possible codeword length. This is accomplished using a multistage approach for packing the variable length codewords. Such an approach is illustrated in FIG. 2.

In the FIG. 2 embodiment, a first stage data storage array 20 and second data storage array 22 are provided. Each array can comprise, for example, a conventional dynamic random access memory (DRAM) array having L cells that can be loaded in parallel. The L cells are stacked similar to a first-in-first-out register, and will roll over from the last cell to the first cell. In other words, once cell A31 of array 20 has been loaded, the next cell loaded will be A0. The number of cells L in the array is directly related to the maximum possible length n of an input codeword, and is described as follows:

$$L = \lceil (n+m-1)/m \rceil \times m.$$

In the example illustrated herein, the maximum length codeword (n) is 19 bits and each byte (m) output from the codeword packer is eight bits in length. Therefore, each stage 20, 22 will require 32 cells (A0 to A31, B0 to B31), which is eight times the upper limit of (19+7)/8, i.e., $$m \times \lceil (n+(m-1))/m \rceil.$$

Each of the arrays 20, 22 is divided into k bytes, where k=L/m. Thus, in the illustrated embodiment, k=32/8=4. The four bytes of the stage one array are illustrated in FIG. 2 by reference numerals 24 (input byte 0), 26 (input byte 1), 28 (input byte 2), and 30 (input byte 3). Similarly, the stage two data storage array contains four bytes represented by reference numerals 34 (output byte 0), 36 (output byte 1), 38 (output byte 2), and 40 (output byte 3).

Unlike the prior art, each of the cells in the stage one array of FIG. 2 only needs to have up to three connections to the incoming codeword. For example, cell A8 (which is the first cell in input byte 1) only needs to be connected to receive input bit D0, input bit D8, or input bit D16 from an input codeword 10. In the event that a new codeword of more than eight bits in length is to be stored commencing with cell A0 of input byte 0, A8 will be loaded with bit D8 of the incoming codeword, as indicated at 70. In the event that a new codeword is to be loaded commencing at cell A8 of byte 1, cell A8 will receive bit D0 of the new codeword as indicated at 72. In the event that a new codeword of more than 16 bits in length is to be loaded commencing at cell A24 of byte 3, A8 will receive bit D16 of the incoming codeword as indicated at 74. It should be noted that the storage of each new codeword commences at the beginning of a byte of the stage one array. Therefore, in the illustrated embodiment, there are only four stage one cells with which the loading of a new codeword can start. These are cells A0, A8, A16, and A24 which represent the start of byte 0, byte 1, byte 2 and byte 3, respectively. The actual byte in which the loading of a new codeword will be commenced is determined by a byte pointer, described in greater detail below.

The stage two data storage array 22 loads codeword data from the stage one array in response to the byte pointer as well as a bit pointer. Each cell (B0 to B31) of the stage two array is connected to its corresponding cell in the stage one array as well as the seven previous cells in the stage one array. Thus, each cell in the stage two array requires eight connections. This is illustrated at 32 for cell B11.

The particular first stage cell that will be used as the input for a second stage cell is determined by the bit pointer. Within each byte, the bit pointer will be incremented from 0 to 7, as illustrated at 60 in FIG. 2. If the bit pointer is zero and the byte pointer points to byte zero, each of cells B0 to B7 will be loaded with the contents of cells A0 to A7. If the codeword being loaded into the second stage array is greater than eight bits in length, the one-to-one correspondence between the stage one and stage two arrays will continue into the successive byte(s).

If the bit pointer is not pointing to zero, the second stage cells will look back by the number of cells referred to by the bit pointer to obtain data from the first stage array. Thus, for example, if the bit pointer is three and cell B11 is being loaded, cell B11 will receive the data from cell A8 of the first stage array. A more detailed operational example of the codeword packer in accordance with the present invention is provided below in connection with the discussion of FIGS. 5a to 5d.

FIG. 3 is a block diagram of an implementation of a two-stage codeword packer in accordance with the present invention. Variable length codewords (for example Huffman codewords) are output from a code table 80 into the stage one data storage array 20 via line 82. Storage array 20 receives a system clock via terminal 21, which refreshes the cells of the array continuously every clock cycle as their content is transferred to the second stage array 22 via l=line 83. The stage two array receives the system clock via terminal 23. Each time a byte has been filled in the stage two array, it is output via one of K lines 25 to a conventional first-in-first-out buffer register (not shown) where it is held for transmission.

At the same time codeword data is input to stage one array 20, data indicative of the code length n of the codeword is input to an accumulator/stack 86 via line 84. The accumulator/stack receives the system clock via terminal 87. The accumulator/stack outputs a byte pointer and a bit pointer, derived from the accumulated total of codeword bits input to stage one array 20 over time. The byte pointer is immediately used by the stage one array to identify in which byte storage of the current codeword should commence in the stage one array. The byte pointer and bit pointer are delayed by exactly one clock cycle by a conventional delay circuit 88 which receives the system clock via terminal 89. The delayed byte pointer is input to the stage two array 22 via line 90. The delayed bit pointer is input to the stage two array via line 92. Accumulator/stack 86 also provides output strobes $W_1$ to $W_k$ on lines 94 which strobe the output buffer to receive the output bytes from lines 25 of the stage two array. An appropriate output strobe will be provided each time a byte boundary is crossed in the stage two array. This will output the just completed full byte of data from the second stage array.

Figure 4:
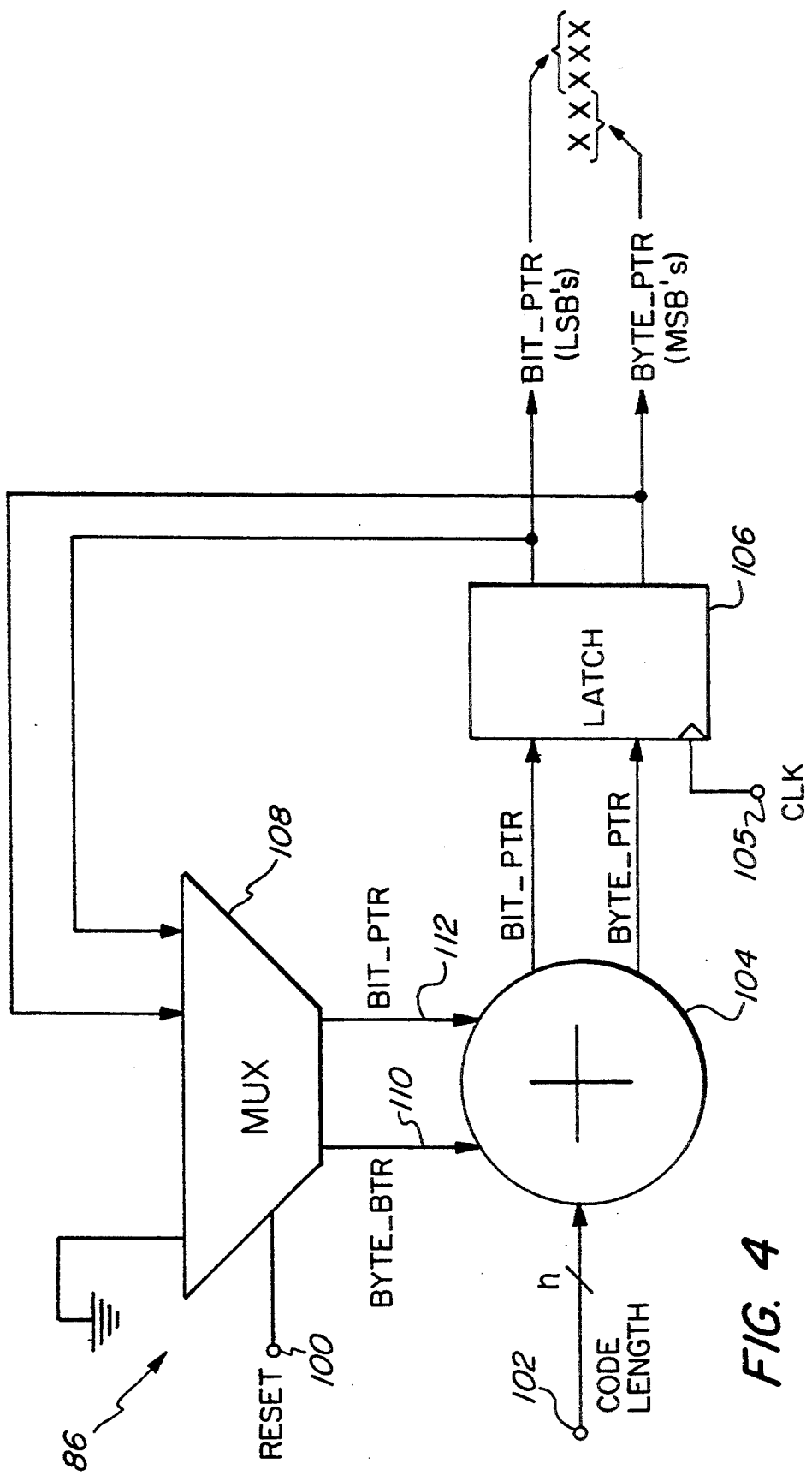
FIG. 4 is a more detailed block diagram of the accumulator stage of the block diagram of FIG. 3.

The accumulator/stack 86 is illustrated in greater detail in FIG. 4. The code length n from the Huffman code table 80 for each codeword is input to an accumulator 104 via terminal 102. Accumulator 104 accumulates the total number of bits into a binary number. In the illustrated embodiment, where each of the stage one and stage two arrays comprise four eight-bit bytes, accumulator 104 is a five-bit accumulator. The accumulator is initialized at the commencement of operation by a reset signal applied to terminal 100 of multiplexer 108, connecting the feedback inputs 110, 112 of the accumulator to ground (i.e., zero). Thus, when the accumulator is reset, the next codeword will be loaded into the stage one array commencing at A0 and into the stage two array commencing at B0. In a preferred embodiment, a plurality of codewords will be grouped together forming a block, and a plurality of blocks will be grouped to form a macroblock. The accumulator is reset at the commencement of each new macroblock.

The output of accumulator 104 is a q-bit binary word with the p least significant bits thereof forming the bit pointer and the remaining (q-p) most significant bits forming the byte pointer. In the illustrated embodiment, where the codeword packer outputs eight-bit bytes, and each of the first and second storage arrays holds four such bytes, the three least significant bits of the five-bit accumulator output are used as the bit pointer and the two most significant bits are used as the byte pointer. It should be appreciated that a bit pointer of three bits can be used to point to any one of the eight bits within a byte, and a byte pointer of two bits can be used to define any one of the four bytes contained in an array. The five-bit word output from accumulator 104 continues to accumulate as the lengths of new codewords are added to the accumulated lengths of past codewords. As the sum of codeword lengths accumulates, the most significant bits above a total of five bits are discarded. A latch 106 holds the bit pointer and byte pointer for output on a cyclical basis according to the system clock, input at terminal 105.

The byte pointer and bit pointer output from latch 106 are fed back to multiplexer 108 for use in accumulating the code lengths over time. They are also output to delay 88 (FIG. 3) for delayed input into the stage two array 22. Delay 88 compensates for the latency caused by the stage one array and thereby matches the correct bit and byte pointers to the incoming data for use in the stage two array. As indicated above, the delay is exactly equal to one clock cycle.

FIGS. 5a–5d provide an example showing how the codeword packer of the present invention operates in an implementation where the maximum codeword length is 19 bits and it is desired to output the codeword data in eight-bit bytes. In such an implementation, each of the first and second stage arrays will contain 32 cells, divided into four eight-bit bytes. In the example illustrated in FIGS. 5a–5d, four consecutive codewords have lengths of seven bits, nine bits, three bits and eight bits. In FIG. 5a, the codeword packer has been reset so that both the bit pointer and byte pointer are zero. Thus, the five-bit word output from code length accumulator 104 is 00000. The three least significant bits "000" indicate that the bit pointer is zero. The two most significant bits "00" indicate that the byte pointer is zero. As a result, the seven-bit codeword received at time $t_1$ by first array 20 is loaded into byte zero in cells A0 to A6, as indicated at 120a. At time $t_2$ (one clock cycle after $t_1$) the seven-bit codeword is transferred from first array 20 into cells B0 to B6 of second array 22, as illustrated at 120b.

Also at time $t_2$, the next codeword, which has a length of nine bits, is received at first array 20 as illustrated in FIG. 5b. At this point, the output from accumulator 104 will be "00111" due to the addition of the seven-bit code length of the first codeword to the prior value 00000 fed back from latch 106 via multiplexer 108. Since the two most significant bits of the current accumulator value 00111 are "00" the new nine-bit codeword is loaded into input byte zero of array 20, commencing at cell A0. Since the new codeword is nine bits in length, it will completely fill byte zero (A0 to A7) with the final bit extending into cell A8 of input byte one, as illustrated at 122a.

At time $t_3$, the nine-bit codeword from first array 20 will be transferred to second array 22. Although data input to the first array 20 overwrites the prior data contained therein, data in the second array 22 cannot be overwritten until it is output. And, since data is only output from the second array 22 in full eight-bit bytes, the prior seven-bit codeword stored in cells B0 to B6 must be saved. Therefore, it is necessary to commence the writing into second array 22 during time $t_3$ at cell B7. This requirement is indicated by the accumulated codeword length 00111, which instructs the second array 22 to commence receiving the next codeword at cell B7 of byte zero. This is clear because the byte pointer formed by the most significant bits of the accumulated code length 00111 is "00" and the bit pointer formed by the least significant bits points to cell B7 ("111"). Consequently, the nine-bit codeword transferred into the second array at time $t_3$ will fill cells B7 to B15. Note that once the second codeword has been transferred to the second array, a total of 16 bits of codeword data will have been received, completely filling both output byte zero and output byte one, as illustrated at 120b, 122b in FIG. 5b. Since both of these bytes are completely full, they will be off-loaded from the second array 22 into a buffer for transmission, under the control of output strobes $W_1$ and $W_k$ from accumulator/stack 86, which knows that first byte boundary 121 and second byte boundary 123 have been reached.

Also at time $t_3$, the first array 20 will be receiving the next codeword, which is three bits in length. The accumulator value at this point in time will be 10000 due to the summation of the prior accumulated value (00111) with the length of the previous nine-bit codeword (01001). Since the byte pointer "10" formed by the two most significant bits of the accumulated code length 10000 is indicative of input byte two, illustrated at 124a in FIG. 5c, the three-bit codeword arriving at time $t_3$ will be loaded into byte two commencing at cell A16. As indicated in FIG. 5c, this will result in cells A16 to A18 being filled with the three-bit codeword. At time $t_4$, this three-bit codeword is transferred to cells B16 to B18 of the second array 22, in response to the bit pointer portion "000" of accumulated code length value 10000. Since at time $t_4$, none of the bytes in the second array 22 is completely full, no data will be off-loaded from the second array at this time.

As indicated in FIG. 5d, the first array 20 will receive the next codeword, which is eight bits in length, during $t_4$. The accumulated code length will now be 10011, resulting from the addition of the prior accumulated value 10000 and the three-bit length (011) of the prior code word. Since the two most significant bits of the current accumulated code length are "10", the byte pointer will continue to point to input byte two in array 20, and the current eight-bit codeword will be loaded into cells A16 to A23.

At time $t_5$, the second array 22 will receive the eight-bit codeword from cells A16 to A23 of the first array 20. Cells B16 to B18 of the second array still contain the three-bit codeword loaded at time $t_4$. Accordingly, the current eight-bit codeword will be loaded into cells B19 to B26, as directed by the byte pointer ("10") pointing to output byte two and the bit pointer ("11") pointing to the cell above the third cell in output byte two. As shown in FIG. 5d, the current eight-bit codeword extends from byte two into byte three, as indicated at 126b. Since byte two of the second array has been filled, as determined by the crossing of byte boundary 125, the eight bits contained in byte two of the second array 22 will be off-loaded at this time.

At time $t_5$, the accumulated code length will be 11011, resulting from the addition of the eight-bit length (1000) of the prior codeword to the prior accumulated code length of 10011. The new accumulated code length value of 11011 will establish a byte pointer of "11" pointing to input byte three (126a) of the first array for the loading of the next codeword (not shown). The bit pointer "011" will instruct the second array 22 to commence loading of the next codeword at cell B27.

The process will continue in this manner, with data that would extend above cells A31 and B31 wrapping around and being written into cells A0 and B0, respectively. After all of the codewords for a macroblock have been received, the codeword packer is reinitialized by applying a reset signal to terminal 100 of multiplexer 108 (FIG. 4). This will result in the first codeword of the next macroblock being written into the first array 20 commencing at cell A0 and the second array 22 commencing at cell B0.

The calculation of the accumulated code lengths used in the example of FIGS. 5a to 5d (successive codeword lengths of seven, nine, three and eight bits) is summarized as follows:

| | |
|---|---|
| Starting Accum. Value | 00000 |
| + 7-bit length | 00111 |
| Time $t_2$ Accum. Value | 00111 |
| + 9-bit length | 01001 |
| Time $t_3$ Accum. Value | 10000 |
| + 3-bit length | 00011 |
| Time $t_4$ Accum. Value | 10011 |
| + 8-bit length | 01000 |
| Time $t_5$ Accum. Value | 11011 |

Since each of the cells in the first array 20 will have a maximum of three connections to the incoming codeword, as illustrated at 70, 72, 74 of FIG. 2, and each of the second array cells will have only eight connections to cells in the first array 20 as illustrated at 32 in FIG. 2, the complexity of the design as compared to prior art single stage codeword packers is substantially reduced. In the illustrated embodiment, only 57 connections will be required between the input codewords and the cells of the first array, with 256 connections required between the cells of the second array and cells of the first array. This totals 313 connections, which is nearly a 50% reduction in complexity over the prior art, which required 608 electrical connections to the cells of the single stage array. In counting the number of connections required between the input codewords and each cell of the first stage array, it must be appreciated that not all of the first array cells will require three separate connections as illustrated at 70, 72, 74 in FIG. 2. This occurs because the maximum length codeword in the embodiment illustrated is only 19 bits, and the loading of each new codeword commences at a byte boundary (i.e., A0, A8, A16, or A24). Thus, for example, cells A19 to A23 will only have to look at two possible bits in the incoming codewords. A19 would look at bits D3 and D11, A20 would look at bits D4 and D12, A21 would look at bits D5 and D13, etc. A 19-bit codeword commencing at either A0 or cell A24 would not extend into cells A19 to A23.

It should now be appreciated that the present invention provides a multistage approach to packing variable length codewords into equal size bytes for transmission. In the illustrated embodiment, the codewords are packed and organized into eight-bit byte boundaries. Codeword data is written into a first stage data array commencing with the first location of a byte designated by a byte pointer. The codeword data is transferred to a second stage data storage array commencing at a particular cell designated by a bit pointer within the byte designated by the byte pointer. The bit and byte pointers are derived from the accumulated length of received codewords. The cells of the first stage array are refreshed continuously every clock cycle and their content is transferred to the second stage array. The cells of the second stage array are continuously refreshed from the previous stage array with the exception of cells that are within the current byte boundary with data that has not yet been output from the second array. Once a byte boundary has been reached and passed in the second stage array, the corresponding byte is off-loaded into a buffer using write strobes generated by the code length accumulator. A separate buffer is provided for each of the bytes defined in the second stage array. The buffers hold the off-loaded bytes for transmission.

Although the invention has been described in connection with a specific embodiment thereof, those skilled in the art will appreciate that numerous adaptations and modifications may be made thereto without departing from the spirit and scope of the invention as set forth in the claims.

We claim:

1. A variable length codeword packer for use in communicating codeword data in successive m-bit bytes comprising:

means for accumulating a binary sum indicative of a total number of codeword bits received over time;

means for deriving a byte pointer from at least one most significant bit of said binary sum;

means for deriving a bit pointer from a plurality of least significant bits of said binary sum;

a first data storage array having a plurality of m-bit first storage bytes and responsive to said byte pointer for storing full variable length codewords among designated ones of said first storage bytes;

a second data storage array having a plurality of m-bit second storage bytes and responsive to said byte and bit pointers for filling said second storage bytes with codeword data from said first data storage array;

clock means for:

clocking said codeword data into said first data storage array one codeword at a time.

inputting said byte, pointer to said first data storage array when a corresponding codeword is clocked therein, clocking said codeword data from said first data storage array into said second data, storage array one codeword at a time, and inputting said byte and bit pointers to said second data storage array when a corresponding codeword is clocked therein; and means for outputting an m-bit byte of codeword data from each filled second storage byte to provide successive m-bit bytes of codeword data; wherein:

incoming variable length codewords are successively stored in said first data storage array, each codeword commencing at the beginning of a particular first storage byte identified by said byte pointer based on the binary sum of preceding codeword bit lengths, and each of the variable length codewords stored in said first data storage array is transferred to said second data storage array commencing at a location within a second storage byte identified by said byte pointer and bit pointer based on the binary sum of preceding codeword bit lengths.

2. A variable length codeword packer in accordance with claim 1 wherein said incoming codewords are grouped in sets containing a plurality of codewords, said codeword packer further comprising:

means for resetting said accumulating means to zero at the beginning of each new set of codewords.

3. A variable length codeword packer in accordance with claim 1 wherein said codewords have a maximum length of n bits, each of said first and second data storage arrays comprise k storage bytes, and each storage byte contains m cells, where $$k = \lceil (n+m-1)/m \rceil.$$

4. A variable length codeword packer in accordance with claim 3 wherein said accumulating means comprise a q-bit accumulator with the p least significant bits thereof forming said bit pointer and the remaining (q-p) most significant bits forming said byte pointer, where p is the number of bits required to identify any one of m cells in a storage byte and (q-p) is the number of bits required to identify any one of k storage bytes.

5. A variable length codeword packer in accordance with claim 4 wherein the codeword data is clocked into said second data storage array one clock cycle after it is clocked into said first data storage array, said codeword packer further comprising:

means for delaying the inputting of said byte and bit pointers to said second data storage array by one clock cycle.

6. A variable length codeword packer in accordance with claim 1 wherein said outputting means are responsive to an incrementing of said byte pointer for outputting data from a second storage byte that has been filled.

7. A variable length codeword packer in accordance with claim 1 wherein the codeword data is clocked into said second data storage array one clock cycle after it is clocked into said first data storage array, said codeword packer further comprising:

means for delaying the inputting of said byte and bit pointers to said second data storage array by one clock cycle.

8. A variable length codeword packer in accordance with claim 7 wherein said incoming codewords are grouped in sets containing a plurality of codewords, said codeword packer further comprising:

means for resetting said accumulating means to zero at the beginning of each new set of codewords.

9. A variable length codeword packer in accordance with claim 8 wherein said outputting means are responsive to an incrementing of said byte pointer for outputting data from a second storage byte that has been filled.

* * * * *